(12) United States Patent
Bikumandla et al.

(10) Patent No.: US 11,477,360 B2
(45) Date of Patent: Oct. 18, 2022

(54) STACKED IMAGE SENSOR WITH POLARIZATION SENSING PIXEL ARRAY

(71) Applicant: Meta Platforms Technologies, LLC, Menlo Park, CA (US)

(72) Inventors: Manoj Bikumandla, Union City, CA (US); John Enders Robertson, Carlsbad, CA (US); Andrew Matthew Bardagjy, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/159,041

(22) Filed: Jan. 26, 2021

(65) Prior Publication Data

US 2021/0360132 A1 Nov. 18, 2021

Related U.S. Application Data

(60) Provisional application No. 63/025,370, filed on May 15, 2020.

(51) Int. Cl.
| | | |
|---|---|---|
| *H04N 5/225* | (2006.01) | |
| *G02B 5/30* | (2006.01) | |
| *G02B 27/28* | (2006.01) | |
| *G02B 1/04* | (2006.01) | |
| *H04N 9/04* | (2006.01) | |

(52) U.S. Cl.
CPC ............. *H04N 5/2258* (2013.01); *G02B 1/04* (2013.01); *G02B 5/3058* (2013.01); *G02B 27/288* (2013.01); *H04N 5/2256* (2013.01); *H04N 9/045* (2013.01)

(58) Field of Classification Search
CPC .... H04N 5/2258; H04N 5/2256; H04N 9/045; G02B 1/04; G02B 5/3058; G02B 27/288
USPC ......................................................... 348/164
See application file for complete search history.

(56) References Cited

U.S. PATENT DOCUMENTS

| | | | |
|---|---|---|---|
| 9,113,096 B1* | 8/2015 | Azuma ................ | H04N 5/2253 |
| 2011/0128623 A1* | 6/2011 | Louh .................... | G02B 5/3033 |
| | | | 359/486.01 |
| 2015/0054962 A1* | 2/2015 | Borthakur ......... | H01L 27/14636 |
| | | | 348/164 |
| 2016/0064439 A1* | 3/2016 | Or-Bach ........... | H01L 27/14623 |
| | | | 257/443 |
| 2016/0163752 A1 | 6/2016 | Sambongi et al. | |
| 2018/0213170 A1 | 7/2018 | Segawa et al. | |
| 2018/0270474 A1* | 9/2018 | Liu ........................ | A61B 6/037 |
| 2018/0309949 A1* | 10/2018 | Fossum ............ | H01L 27/14621 |

(Continued)

OTHER PUBLICATIONS

International Searching Authority, Patent Cooperation Treaty, European Application No. PCT/US2021/030374, dated Jul. 23, 2021, 3 pages.

(Continued)

*Primary Examiner* — James T Boylan
(74) *Attorney, Agent, or Firm* — Freestone Intellectual Property Law PLLC; Aaron J. Visbeek; William J. Pigott

(57) ABSTRACT

A sensor includes a first image pixel array including first image pixels and a second image pixel array including second image pixels. A polarization layer is disposed between the first image pixels and the second image pixels. Scene light incident upon the second image pixels propagates through the first image pixels and the polarization layer to reach the second image pixels.

15 Claims, 7 Drawing Sheets

(56) References Cited

U.S. PATENT DOCUMENTS

2019/0096932 A1  3/2019  Hseih et al.
2021/0150744 A1* 5/2021  Sambongi .............. H04N 13/25

OTHER PUBLICATIONS

International Searching Authority, Patent Cooperation Treaty, Written Opinion of the International Searching Authority, European Application No. PCT/US2021/030374, dated Jul. 23, 2021, 5 pages.

* cited by examiner

STACKED IMAGE SENSOR WITH POLARIZATION SENSING PIXEL ARRAY

CROSS-REFERENCE TO RELATED APPLICATIONS

This application claims priority to U.S. provisional Application No. 63/025,370 filed May 15, 2020, which is hereby incorporated by reference.

TECHNICAL FIELD

This disclosure relates generally to optics and image sensors.

BACKGROUND INFORMATION

Cameras are ubiquitous in consumer electronics. For example, smart phones, tablets, action-cameras, laptops, and even monitors may incorporate a camera. Typically, the cameras that are incorporated into consumer electronics include a lens assembly paired with a complementary metal-oxide semiconductor (CMOS) image sensor to capture a color image. In particular contexts, capturing data in addition to the color image may be advantageous.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Figure 1A:
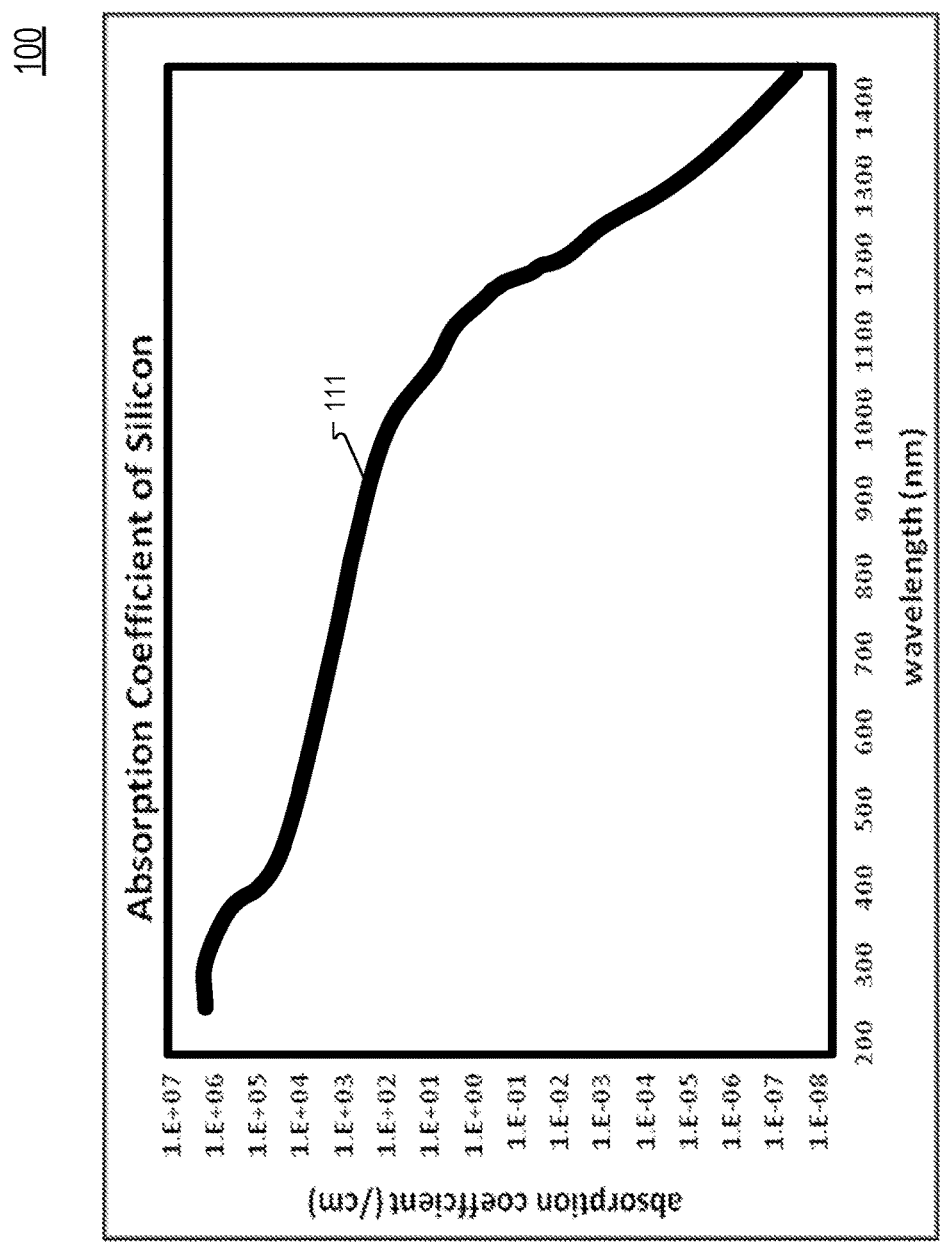
FIG. 1A illustrates a chart showing a relationship trend line between an absorption coefficient of silicon with respect to a wavelength of light, in accordance with aspects of the disclosure.

Embodiments of a stacked image sensor with a polarization sensing pixel array are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light may be defined as light having a wavelength range of approximately 700 nm-1 mm. In aspects of this disclosure, near-infrared light may be defined as having a wavelength range of approximately 700 nm-1.4 µm.

Aspects of this disclosure include a stacked image sensor that includes a red-green-blue (RGB) visible light image pixel array disposed over a second image pixel array that is polarization-sensitive to infrared wavelengths. The RGB image pixel array may be bonded to the second image pixel array. The RGB silicon die of the RGB image pixel array may be a back-side illuminated (BSI) image pixel array bonded to a front-side illuminated (FSI) polarization-sensitive silicon die. The polarization-sensitive image pixel array may have linear polarizers disposed over the image pixels at different orientation to measure the polarity of incident infrared light. Notably, the polarization-sensitive image pixel array may rely on the depth of the silicon in the RGB silicon die to filter out visible light (infrared light penetrates deeper into silicon than visible). The resulting stacked image sensor provides both standard RGB images laid over polarization information. The additional polarization information can be used in a variety of contexts including assisting in determining a surface material in an image (e.g. metal surfaces tend to reflect a particular polarization of light while a wood surface may scatter randomly polarized light). An artificial intelligence or an advanced vision system may create synthetic textures based on polarization signatures and the co-location of color allows for more accurate rendering. Furthermore, the polarization information may assist in determining a depth-of-field of particular objects in the image. In some implementations, the RGB image pixel array is replaced with an infrared image pixel array that is sensitive to infrared light. In these implementations, a filter that passes infrared light and blocks visible light may be disposed over the infrared image pixel array. The filter may be a bandpass filter tuned to pass only a particular wavelength of infrared light (e.g. 850 nm). These and other embodiments are described in more detail in connections with FIGS. 1A-4.

FIG. 1A illustrates a chart 100 showing a relationship trend line 111 between an absorption coefficient of silicon with respect to a wavelength of light. Notably, the shorter wavelengths of light are absorbed by silicon earlier than longer wavelengths of light such that red wavelengths and near-infrared (NIR) wavelengths of light penetrate a greater depth into silicon.

Figure 1B:
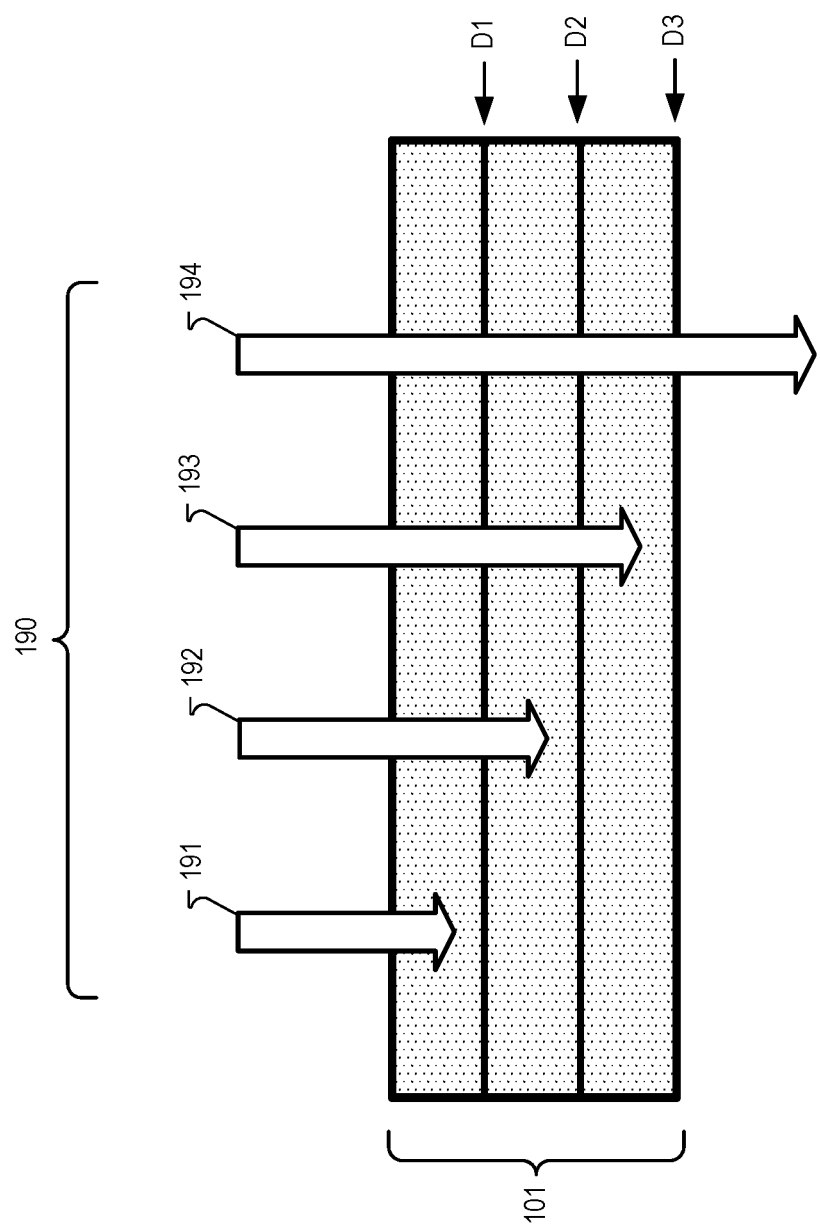
FIG. 1B illustrates a penetration of light wavelengths into an example silicon substrate, in accordance with aspects of the disclosure.

FIG. 1B illustrates a penetration of wavelengths in incident light 190 into an example silicon substrate 101. For example, blue light 191 in incident light 190 is absorbed at a depth D1 of silicon substrate 101. Green light 192 in incident light 190 is absorbed at a depth D2 of silicon substrate 101 and blue light 193 in incident light 190 is absorbed at a depth D3 of silicon substrate 101. Notably, at least a portion of near-infrared light 194 included in incident light 190 penetrates through silicon substrate 101.

Figure 2A:
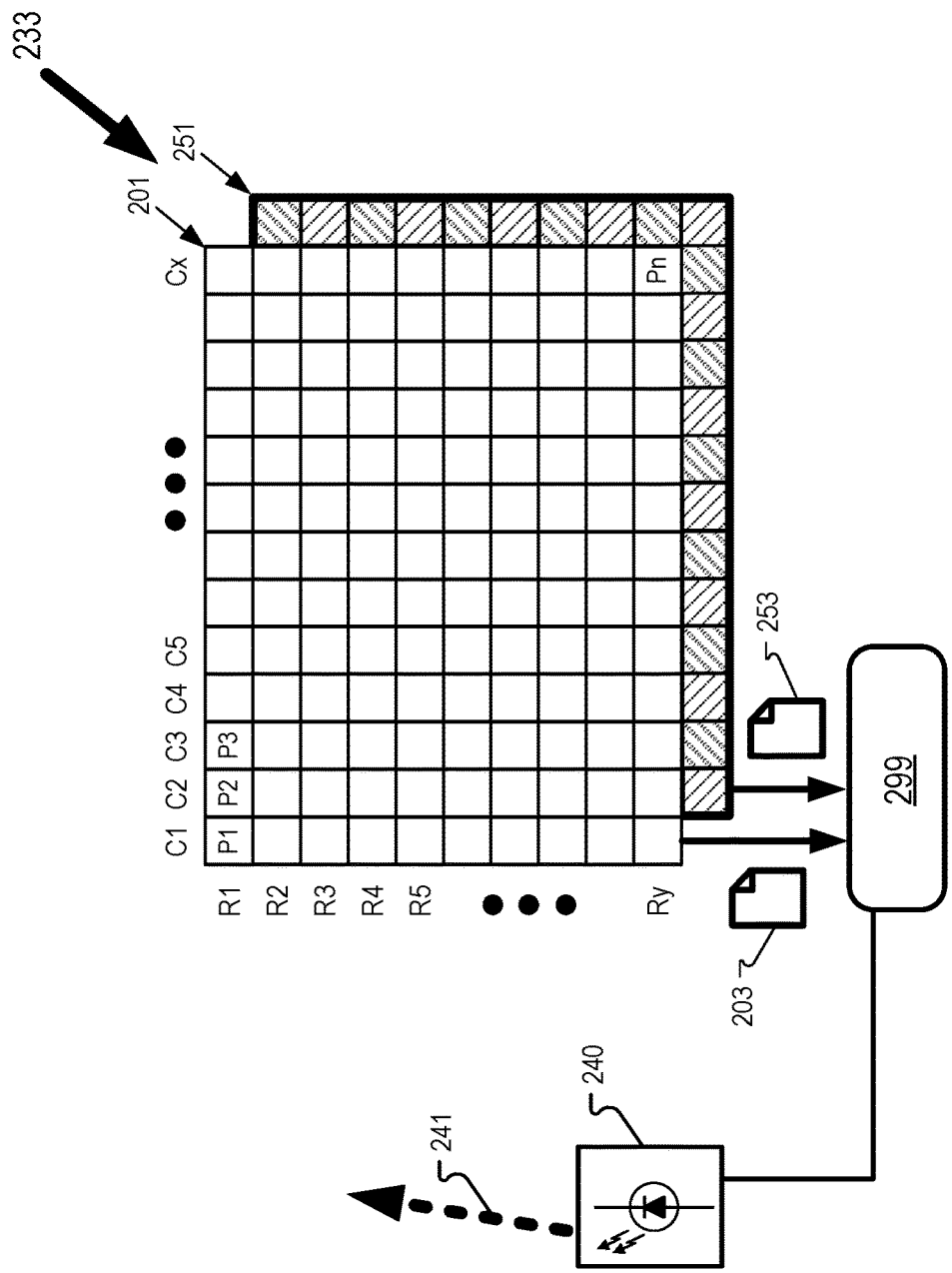
FIG. 2A illustrates a diagram of a system that includes a stacked image sensor, in accordance with aspects of the disclosure.

FIG. 2A illustrates a diagram of system 200 that includes a stacked image sensor 233, in accordance with aspects of the disclosure. Stacked image sensor 233 includes a first image pixel array 201 disposed over a second image pixel array 251. First image pixel array 201 is configured to capture a first image 203 and provide the first image 203 to processing logic 299. Second image pixel array 251 is configured to capture a second image 253 and provide the second image 253 to processing logic 299. First image pixel array 201 has integer n image pixels (P1, P2, P3 . . . Pn) arranged in integer x columns and integer y rows. First image pixel array 201 may be a complementary metal-oxide semiconductor (CMOS) image sensor. Second image pixel array 251 may be configured similarly to first image pixel array 201. Second image pixel array 251 may have the same number of image pixels as first image pixel array 201 or more image pixels as first image pixel array 201. In some implementations, first image pixel array 201 and second image pixel array 251 have the same number of image pixels (that is they have the same resolution). FIG. 2A shows that, in some implementations, processing logic 299 may be configured to drive infrared light source 240 to emit infrared illumination light 241 toward a scene that stacked image sensor 233 is positioned to image.

Figure 2B:
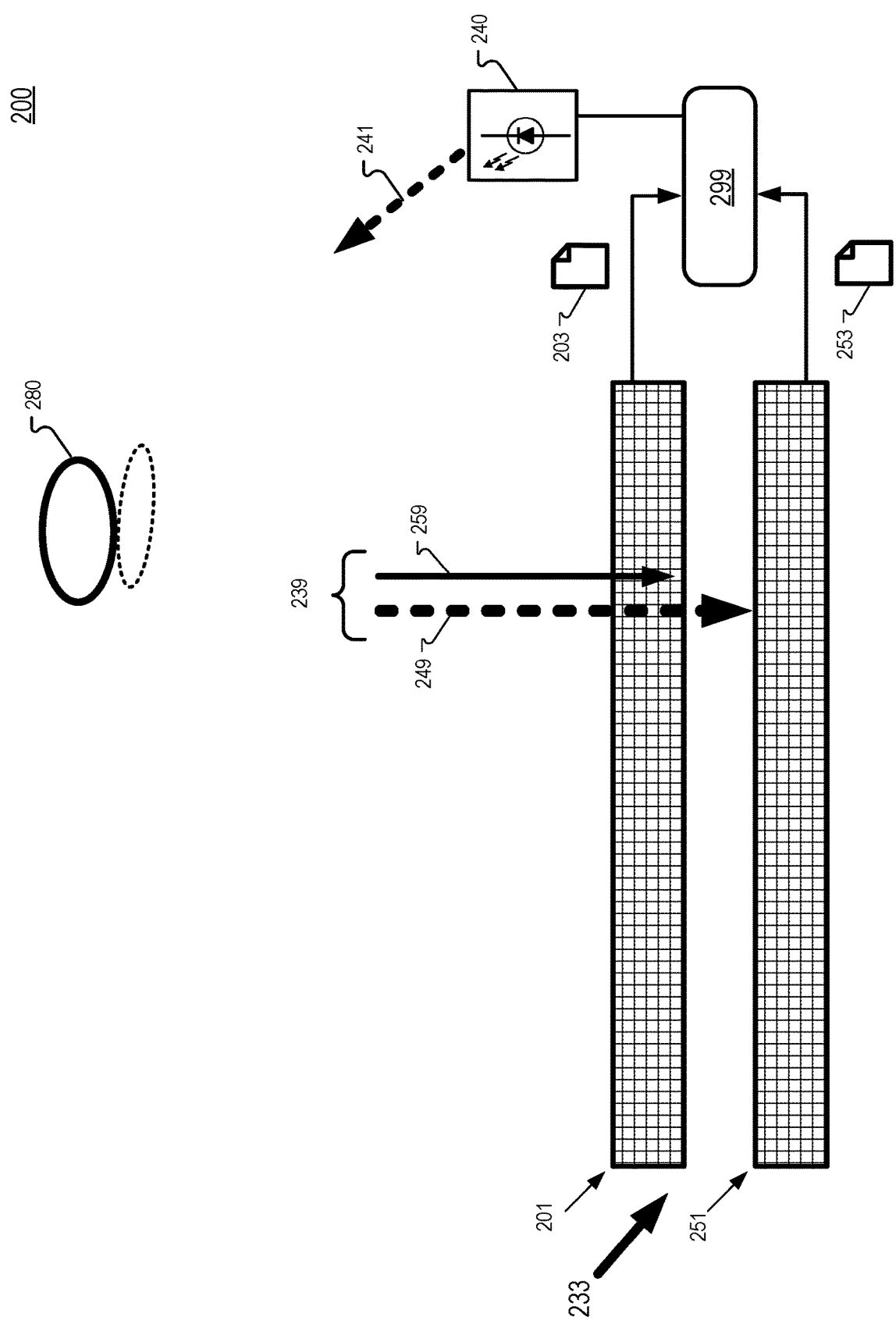
FIG. 2B illustrates a side view of a stacked image sensor, in accordance with aspects of the disclosure.

FIG. 2B illustrates a side view of stacked image sensor 233 in system 200, in accordance with aspects of the disclosure. FIG. 2B illustrates that processing logic 299 may be configured to selectively activate infrared source 240 to emit infrared illumination light 241 to illuminate a scene. Infrared source 240 might include a laser diode, a vertical-cavity side-emitting laser (VCSEL), an infrared superluminescent LED (SLED or S-LED), or an infrared LED. Infrared source 240 may emit infrared illumination light 241 having a narrow linewidth. Infrared illumination light 241 may be centered around 850 nm, 940 nm or 1400 nm, for example. The wavelength of infrared illumination light 241 may be based on the bandgap of the semiconductor of second image pixel array 251. The semiconductor used for second image pixel array 251 may be silicon (Si) or silicon-germanium (Si—Ge).

In FIG. 2B, infrared illumination light 241 illuminates a scene that stacked image sensor 233 is configured to image. Stacked image sensor 233 is configured to receive scene light 239 that includes scene light 259 and a portion of infrared illumination light 241 that is reflected/scattered by object(s) 280 as incoming infrared light 249. Object(s) 280 in the scene also reflect/scatter scene light 259 that includes visible light.

FIG. 2B illustrates that visible light of scene light 259 is fully or mostly absorbed by the silicon in the first image pixel array 201 and therefore no visible light or a small portion of visible light propagates through first image pixel array 201 to become incident upon the second image pixel array 251. In the illustrated implementation, first image pixel array 201 is configured to capture a red-green-blue (RGB) image 203 of the incident scene light 259 and the second image pixel array 251 is configured to capture a polarization image 253 that includes polarization orientations of the incident scene light.

Figure 2C:
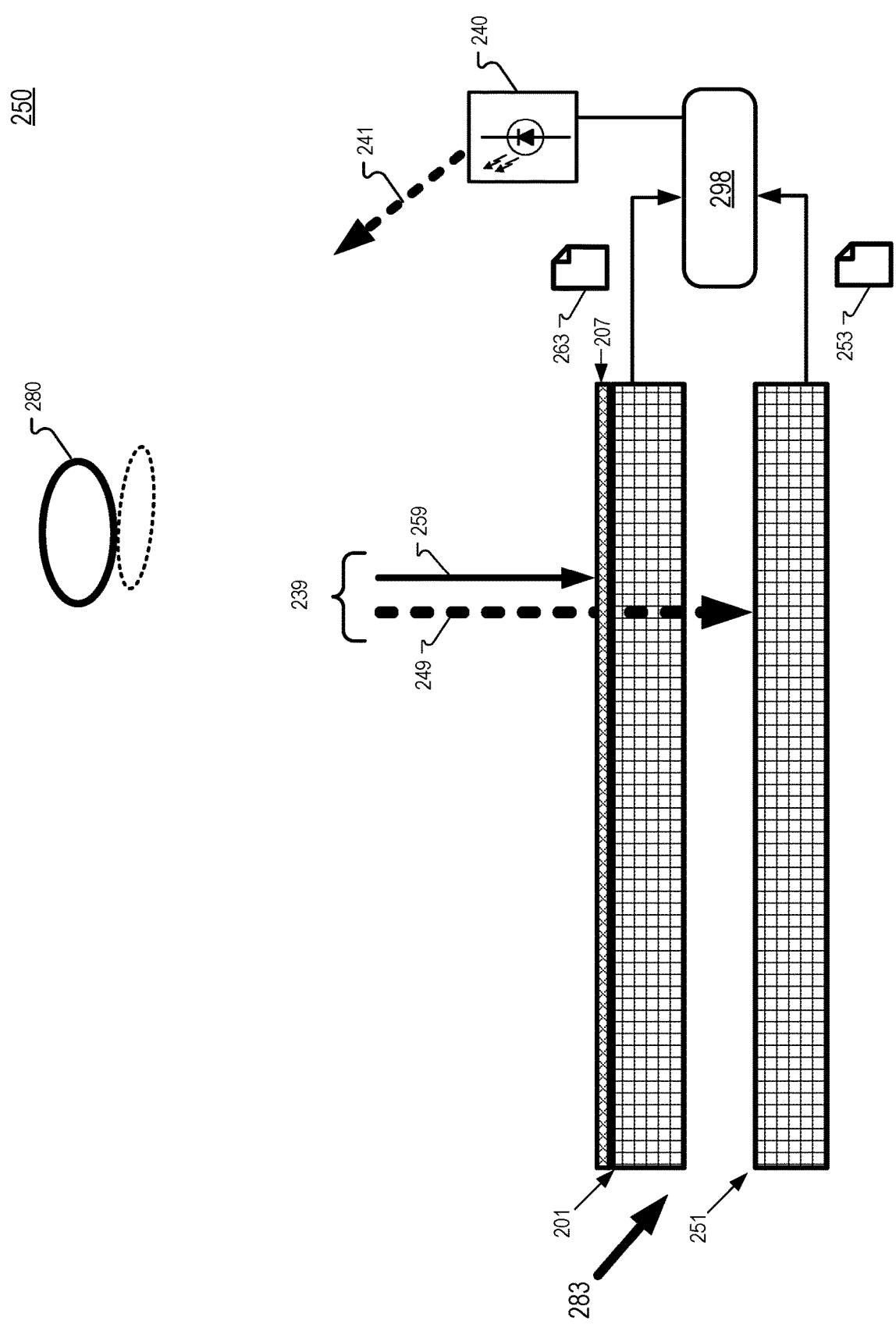
FIG. 2C illustrates an infrared filter disposed over a first image pixel array so that the first image pixel array is configured to capture a near-infrared image, in accordance with aspects of the disclosure.

FIG. 2C illustrates an additional implementation of the disclosure as a system 250 having an infrared filter 207 disposed over first image pixel array 201 so that first image pixel array 201 is configured to capture a near-infrared image 263 instead of RGB image 203. In FIG. 2C, stacked image sensor 283 includes an infrared filter 207, first image pixel array 201, and second image pixel array 251. In the illustrated implementation, an infrared filter 207 that receives a narrow-band infrared wavelength may be placed over the first image pixel array 201 so it is sensitive to a particular narrowband near-infrared wavelength while rejecting visible light in scene light 259 and wavelengths outside the narrow-band. The infrared filter 207 may be matched to the linewidth of infrared illumination light 241 emitted by infrared source 240. Incoming infrared light 249 is imaged by first image pixel array 201 and at least a portion of the incoming infrared light 249 also penetrates through the semiconductor layer of first image pixel array 201 to become incident upon second image pixel array 251. The portion of incoming infrared light 249 that becomes incident upon second image pixel array 251 is imaged to generate polarization image 253.

Processing logic 298 may be configured to drive infrared light source 240 to emit infrared illumination light 241 toward a scene that stacked image sensor 283 is positioned to image (i.e. the scene is in a field-of-view of the stacked image sensor). First image pixel array 201 is configured to capture near-infrared image 263 and provide near-infrared image 263 to processing logic 298. Second image pixel array 251 is configured to capture a second image 253 and provide the second image 253 to processing logic 298. Second image 253 may be a polarization image that includes polarization orientations of scene light 239.

Second image pixel array 251 may be configured with angle-sensitive pixels, in some embodiments. Diffractive gratings may be disposed above the pixels to provide the angle-sensitive pixels. The diffractive gratings may be fabricated in a photolithography process. The angle-sensitive pixels may be included in addition to the polarization-sensitive pixels of second image pixel array 251.

Figure 3:
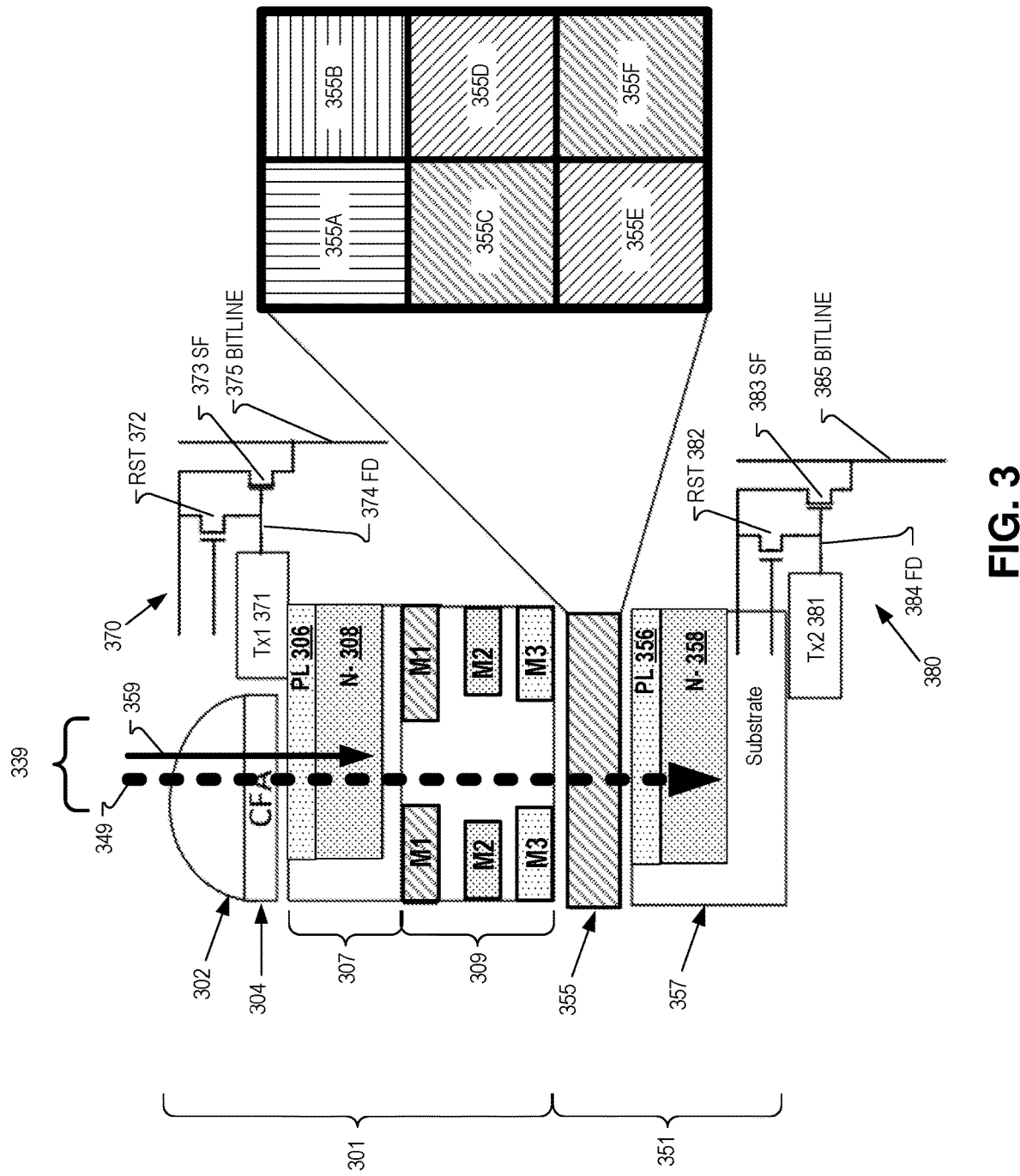
FIG. 3 illustrates an image pixel diagram including a first pixel from a first image pixel array disposed over a second pixel from a second image pixel array, in accordance with aspects of the disclosure.

FIG. 3 illustrates an image pixel diagram including a first pixel 370 from a first image pixel array 301 disposed over a second pixel 380 from a second image pixel array 351, in accordance with aspects of the disclosure. The first pixel and the second pixel are illustrated as including pinned photodiodes, although other photodiode configurations may be utilized. The pinned photodiode of first pixel 370 includes pinning layer 306 and N-doped layer 308. After an accumulation period to capture an image, transistor Tx1 371 transfers the image charge generated by incident light 359 to floating diffusion (FD) 374. The image charge is amplified by source follower (SF) 373 to become an image signal that is read out on bitline 375. Reset (RST) transistor 372 then resets FD 374 and the pinned photodiode (while Tx1 371 is also activated) for the next accumulation period to capture a subsequent image. The pinned photodiode of second pixel 380 includes pinning layer 356 and N-doped layer 358. After an accumulation period to capture a polarization image of incident infrared light 349, transistor Tx2 381 transfers the image charge generated by incident infrared light 349 to floating diffusion (FD) 384. The image charge is amplified by source follower (SF) 383 to become an image signal that is read out on bitline 385. Reset (RST) transistor 382 then resets FD 384 and the pinned photodiode (while Tx2 381 is also activated) for the next accumulation period to capture a subsequent polarization image. First image pixel array 301 and second image pixel array 351 capture the RGB image and the polarization image simultaneously, in some implementations.

Second image pixel array 351 includes a polarization layer that has varying polarization filters disposed over the image pixels of the second image pixel array 351 to sense the polarization orientation of the scene light 339 incident upon particular image pixels in the second image pixel array 351. In particular, incoming infrared light 349 propagates through first image pixel array 301 (including through silicon substrate layer 307 and metal interconnects layer 309), through polarization layer 355, and becomes incident upon substrate layer 357. Incoming infrared light 349 generates an image signal in the silicon of substrate layer 357 and is read out using a 3T or 4T image pixel architecture onto the bitline 385, as described above. In the illustration of FIG. 3, first image pixel array 301 includes a microlens 302 to focus scene light 339 and a color filter array (CFA) 304 to transmit particular colors (e.g. RGB) while blocking other wavelengths from transmitting to an image pixel. The first image pixel array 301 may include a color filter layer configured in a Bayer arrangement (RGGB), for example. Panchromatic filters such as red-cyan-cyan-blue (RCCB) or red-yellow-green-blue (RYGB) may also be used in the color filter layer.

Incoming infrared light 349 only propagates to the silicon substrate 357 when the polarization filter disposed over the second image pixel passes the particular polarization orientation of the incoming infrared light 349. For example, if the polarization filter in the polarization layer that is disposed over the second pixel passes s-polarized light, only incoming infrared light 349 having s-polarization orientation will pass the polarization filter to generate an image signal on the second pixel.

The right side of FIG. 3 illustrates varying polarization filters 355A-355F in polarization layer 355 that may be disposed over a pixel. The polarization filters may be wire grid polarizers. The polarization filters may be polyvinyl alcohol (PVA) linear polarizers. The polarization filters block particular polarization orientations while passing other polarization orientation. An example polarization filter may pass s-polarized light and block p-polarized light. A different polarization filter may pass p-polarized light and block s-polarized light. Consequently, the image pixel disposed beneath a particular polarization filter will generate an image signal representative of an intensity of a particular polarization orientation of the light that is co-located with an RGB image. Each polarization filter 355A-F may have a one-to-one correspondence with the second pixels in the second image pixel array 351. In an embodiment, a wire grid polarization layer is formed in metal interconnects layer 309 of first image pixel array 301 instead of adding a separate polarization layer 355.

The disclosed stacked image sensor provides RGB images (visible light) laid over a polarization image. Another implementation of the disclosure (e.g. stacked image sensor 283 of FIG. 2C) includes a stacked image sensor that provides infrared images laid over a polarization image. The additional polarization information of the polarization image can be used in a variety of contexts including assisting in determining a surface material in an image (e.g. metal surfaces tend to reflect a particular polarization of light while a wood surface may scatter randomly polarized light). Thus, for image processing purposes, the polarization information may be used to determine the content, substance, or material of a scene imaged by the stacked image sensor. Furthermore, the polarization information may assist in determining a depth-of-field of particular objects in the image where the polarization information indicates that two surfaces that appear the same in the RGB or infrared image are actually different surfaces positioned in different depth-of-fields. The disclosed stacked image sensor may be particularly useful in low-light or high-brightness imaging contexts. The disclosed stacked image sensor may also be particularly useful in imaging contexts where the scene-to-be-imaged includes both high-brightness and low-light scenarios (e.g. indoors transitioning to outdoor bright sunlight).

Figure 4:
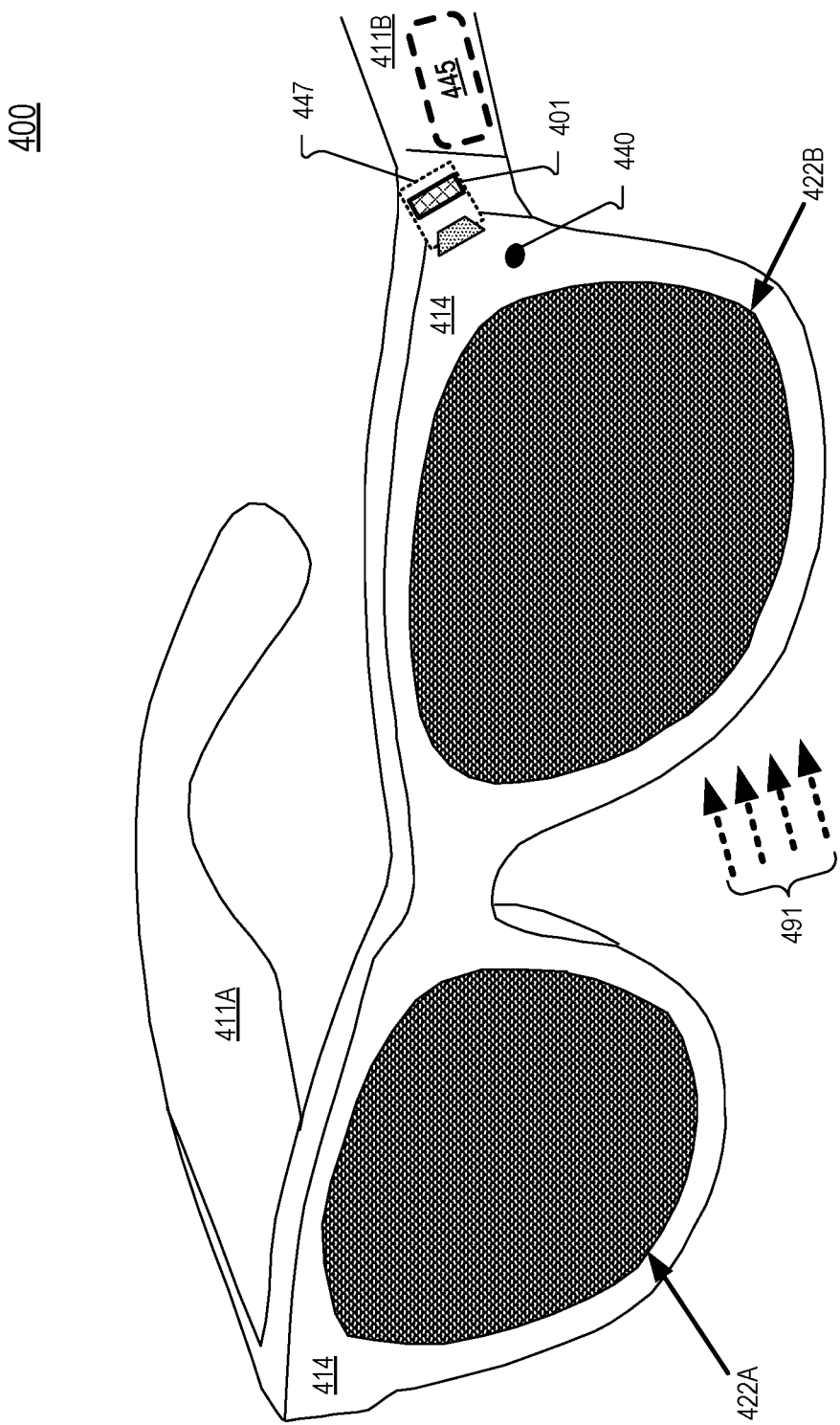
FIG. 4 illustrates a head mounted device that includes a stacked image sensor included in a camera, in accordance with aspects of the disclosure.

FIG. 4 illustrates a head mounted device 400 that includes a stacked image sensor 401 included in a camera 447, in accordance with aspects of the disclosure. Image sensor 401 may include the features of the stacked image sensors of the disclosure to capture images of scene light 491. A near-infrared emitter 440 may be included in head mounted device 400 to illuminate objects in the environment with narrow-band near-infrared light. Head mounted device 400 may include various electronics such as a camera 447 and/or processing logic 445.

Head mounted device 400 include arms 411A and 411B coupled to a frame 414. Optical elements 422A and 422B are included in frame 414. In some implementations, optical elements 422A and/or 422B include a near-eye display for presenting images to a user of head mounted device 400. In this context, head mounted device 400 may be considered a head mounted display (HMD). One or more cameras 447 included in head mounted device 400 may include a stacked image sensor 401 so that head mounted device 400 is capable of capturing RGB image laid over a polarization image or capture an infrared image laid over a polarization image. Consequently, the head mounted device 400 may have improved capability to determining surface materials of environmental objects and/or determining a depth-of-field of surrounding objects, for example.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HIVID) connected to a host computer system, a standalone HMD, a mobile device or computing system, or any other hardware platform capable of providing artificial reality content to one or more viewers.

The term "processing logic" (e.g. 299 or 298) in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Communication channels may include or be routed through one or more wired or wireless communication utilizing IEEE 802.11 protocols, BlueTooth, SPI (Serial Peripheral Interface), I²C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A stacked sensor comprising:
a first image pixel array including first image pixels, a metal interconnects layer, and a polarization layer, wherein the first image pixel array is a back-side illuminated image pixel array; and
a second image pixel array including second image pixels, wherein the second image pixel array is a front-side illuminated polarization sensitive silicon die that is bonded to the first image pixel array,
wherein:
the polarization layer is formed of the metal interconnects layer of the back-side illuminated image pixel array,
the metal interconnects layer and the polarization layer are disposed between the first image pixels and the second image pixels, and
scene light incident upon the second image pixels propagates through the first image pixels, the metal interconnects layer, and the polarization layer to reach the second image pixels.

2. The stacked sensor of claim 1, wherein a silicon substrate of the first image pixels only allows an infrared portion of the scene light to propagate through the first image pixels to the second image pixels.

3. The stacked sensor of claim 1, wherein:
the first image pixel array is configured to capture a red-green-blue (RGB) image of the incident scene light, and
the second image pixel array is configured to capture a polarization image that includes polarization orientations of the incident scene light that propagates through the first image pixels.

4. The stacked sensor of claim 1, wherein:
the first image pixel array is configured to capture a near-infrared image of the incident scene light, and
the second image pixel array is configured to capture a polarization image that includes polarization orientations of the incident scene light.

5. The stacked image sensor of claim 1, wherein:
the polarization layer includes a plurality of polarization filters, and
the polarization filters in the plurality are configured to pass different polarization orientations of the scene light.

6. The stacked image sensor of claim 1, wherein:
the polarization layer includes a plurality of polarization filters, and
a polarization axis of the polarization filters in the plurality of polarization filters have varying orientations.

7. The stacked image sensor of claim 6, wherein the polarization filters include wire-grid linear polarizers.

8. The stacked image sensor of claim 6, wherein the polarization filters include polyvinyl alcohol (PVA) linear polarizers.

9. A camera system comprising:
a first image pixel array including first image pixels, a metal interconnects layer, and a polarization layer, wherein the first image pixel array is a back-side illuminated image pixel array;
a second image pixel array including second image pixels, wherein the second image pixel array is a front-side illuminated polarization sensitive silicon die that is bonded to the first image pixel array,
wherein:

the polarization layer is formed of the metal interconnects layer of the back-side illuminated image pixel array, and the metal interconnects layer and the polarization layer are disposed between the first image pixels and the second image pixels; and processing logic configured to receive a first image from the first image pixel array and configured to receive a second image from the second image pixel array, wherein:

the second image is generated from infrared scene light incident upon the second image pixels of the second image pixel array, and the infrared scene light incident upon the second image pixels propagates through the first image pixels, the metal interconnects layer, and the polarization layer prior to the second image pixels.

10. The camera system of claim 9, wherein:
the first image pixel array is configured to capture a red-green-blue (RGB) image of the incident scene light, and
the second image pixel array is configured to capture a polarization image that includes polarization orientations of the infrared scene light that propagates through the first image pixels.

11. The camera system of claim 9, wherein:
the first image pixel array is configured to capture a near-infrared image of the infrared scene light, and
the second image pixel array is configured to capture a polarization image that includes polarization orientations of the infrared scene light.

12. The camera system of claim 9, wherein:
the polarization layer includes a plurality of polarization filters, and
the polarization filters in the plurality are configured to pass different polarization orientations of the scene light.

13. A head mounted device comprising:
a near-infrared emitter configured to emit near-infrared light; and
a stacked image sensor including:
a first image pixel array including first image pixels, a metal interconnects layer, and a polarization layer, wherein the first image pixel array is a back-side illuminated image pixel array; and
a second image pixel array including second image pixels, wherein the second image pixel array is a front-side illuminated polarization sensitive silicon die that is bonded to the first image pixel array,
wherein the polarization layer is formed of the metal interconnects layer of the back-side illuminated image pixel array,
wherein the metal interconnects layer and the polarization layer are disposed between the first image pixels and the second image pixels, and
wherein scene light incident upon the second image pixels propagates through the first image pixels, the metal interconnects layer, and the polarization layer to reach the second image pixels.

14. The head mounted device of claim 13 further comprising:
processing logic configured to drive the stacked image sensor to initiate an image capture while driving the near-infrared emitter to emit the near-infrared light.

15. The head mounted device of claim 13, wherein:
the first image pixel array is configured to capture a red-green-blue (RGB) image of the incident scene light, and
the second image pixel array is configured to capture a polarization image that includes polarization orientations of the near-infrared light scattered by objects in the field-of-view of the stacked image sensor.

* * * * *